United States Patent [19]
Taft et al.

[11] Patent Number: 5,300,454
[45] Date of Patent: Apr. 5, 1994

[54] METHOD FOR FORMING DOPED REGIONS WITHIN A SEMICONDUCTOR SUBSTRATE

[75] Inventors: Robert C. Taft; Ravi Subrahmanyan, both of Austin, Tex.

[73] Assignee: Motorola, Inc., Schaumburg, Ill.

[21] Appl. No.: 982,164

[22] Filed: Nov. 24, 1992

[51] Int. Cl.$^5$ ............................................. H01L 21/22
[52] U.S. Cl. ...................... 437/154; 148/DIG. 106; 148/DIG. 151; 148/DIG. 157
[58] Field of Search ............... 437/152, 153, 154, 958, 437/962, 59; 148/DIG. 32, DIG. 38, DIG. 106, DIG. 145, DIG. 151, DIG. 157, DIG. 9

[56] References Cited

U.S. PATENT DOCUMENTS

| | | | |
|---|---|---|---|
| 3,775,192 | 11/1973 | Beale | 148/DIG. 106 |
| 4,573,257 | 3/1986 | Hulseweh | 148/DIG. 106 |
| 4,648,174 | 3/1987 | Temple et al. | 148/DIG. 106 |
| 4,830,981 | 5/1989 | Baglee et al. | 437/52 |
| 4,987,089 | 1/1991 | Roberts | 148/DIG. 9 |

FOREIGN PATENT DOCUMENTS

| | | | |
|---|---|---|---|
| 0143179 | 12/1978 | Japan | 437/154 |
| 3245525 | 11/1991 | Japan | 437/958 |

OTHER PUBLICATIONS

"A Buried N-Grid For Protection Against Radiation Induced Charge Collection in Electronic Circuits", Wordeman et al., 1981 IEEE IEDM '81, pp. 40–43.

*Primary Examiner*—Brian E. Hearn
*Assistant Examiner*—C. Chaudhari
*Attorney, Agent, or Firm*—Keith E. Witek

[57] ABSTRACT

A method for forming a first doped region (24) and a second doped region (26) within a substrate (12). A masking layer (14) overlies the substrate (12). A first region (20) of the masking layer (14) is etched to form a first plurality of openings. A second region (22) of the masking layer (14) is etched to form a single opening or a second plurality of openings different in geometry from the first plurality of openings. A single ion implant step or an equivalent doping step is used to dope exposed portions of the substrate (12). The geometric differences in the masking layer (14) between region (20) and region (22) results in the formation of the first and second doped regions (24 and 26) wherein the first and second doped regions (24 and 26) vary in doping uniformity, doping concentration, and doping junction depth.

24 Claims, 8 Drawing Sheets

IMPLANT

METHOD FOR FORMING DOPED REGIONS WITHIN A SEMICONDUCTOR SUBSTRATE

Field of the Invention

The present invention relates generally to semiconductor technology, and more particularly, to the formation of doped regions.

BACKGROUND OF THE INVENTION

Integrated circuits are continually becoming more complex. Because of increased complexity, integrated circuit substrates are required to have several doped regions of varying size and doping concentration. The doped regions may function as transistor current electrodes (i.e. source, drain, emitter, collector), transistor control electrodes (i.e. base and/or gate), interconnects, well regions, isolation regions, contact areas, and the like. If various integrated circuit technologies, such as complementary metal oxide semiconductor (CMOS) technologies, bipolar technologies, analog circuitry, high-power devices, memory elements (such as erasable programmable read only memory {EPROM}), are combined onto a single integrated circuit, an increased number of doped regions are usually required.

The formation of each doped region is performed sequentially. For example, an integrated circuit having a memory array of EPROMs, and supporting both bipolar and CMOS devices may require up to four well regions (one for the memory, two for the CMOS devices, and one for the bipolar devices) and may require numerous buried layers. Each well region may have a different optimal junction depth, optimal doping profile, and geometric shape. For these reasons, in order to optimize all of the four well regions, the four well regions are often formed independently and individually in a sequential fashion. Due to the independent formation, the alignment of well regions to each other is not always consistent. In addition, several photolithographic masking steps and diffusion steps (or implant steps) are required. The sequential process is therefore not time optimal or resource optimal.

SUMMARY OF THE INVENTION

The previously mentioned disadvantages are overcome and other advantages achieved with the present invention. In one form, the present invention comprises a method for forming a first doped region and a second doped region of a semiconductor integrated circuit. A substrate is provided. A masking layer is formed overlying the substrate. The masking layer has a first region and a second region wherein the first region of the masking layer has a feature defined by a first geometry and the second region of the masking layer has a feature defined by a second geometry. A single doping step is used to form both the first doped region and second doped region within the substrate. The first doped region has a first doping concentration and is formed under the first region of the masking layer. The second doped region has a second doping concentration and is formed under the second region of the masking layer. The first doping concentration is different from the second doping concentration.

The present invention will be more clearly understood from the detailed description below in conjunction with the accompanying drawings.

DESCRIPTION OF A PREFERRED EMBODIMENT

Figure 1:
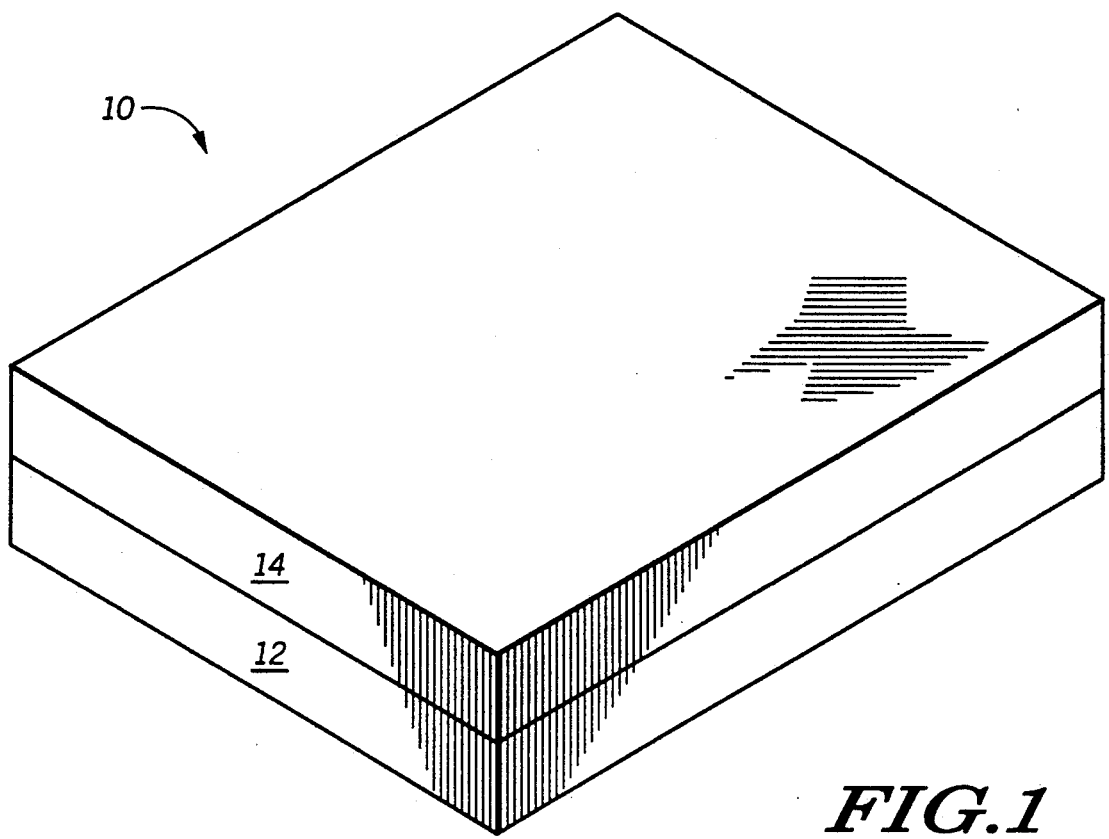
FIGS. 1-3 illustrate, in three-dimensional perspective form, a method for forming a doped region in accordance with the present invention.

Illustrated in FIG. 1 is a structure suitable for formation of a doped region 10. A substrate 12 is provided. Substrate 12 may be made of silicon, gallium arsenide, silicon on sapphire, epitaxial formations, germanium, germanium silicon, polysilicon, diamond, silicon on insulator (SOI), and/or like substrate materials. Preferably, the substrate 12 is made of silicon. A masking layer 14 is formed overlying the substrate 12. In some cases, the masking layer may be made of a hard mask material or a dielectric material such as silicon dioxide or silicon nitride. The masking layer 14 may also be a composite masking material such as oxide-nitride-oxide (ONO), oxide-polysilicon-oxide, composite dielectrics, or the like. In a preferred form, the masking layer 14 is a layer of photosensitive material such as photoresist. Many forms of photoresist exist in the art and all are applicable to masking layer 14.

Figure 2:
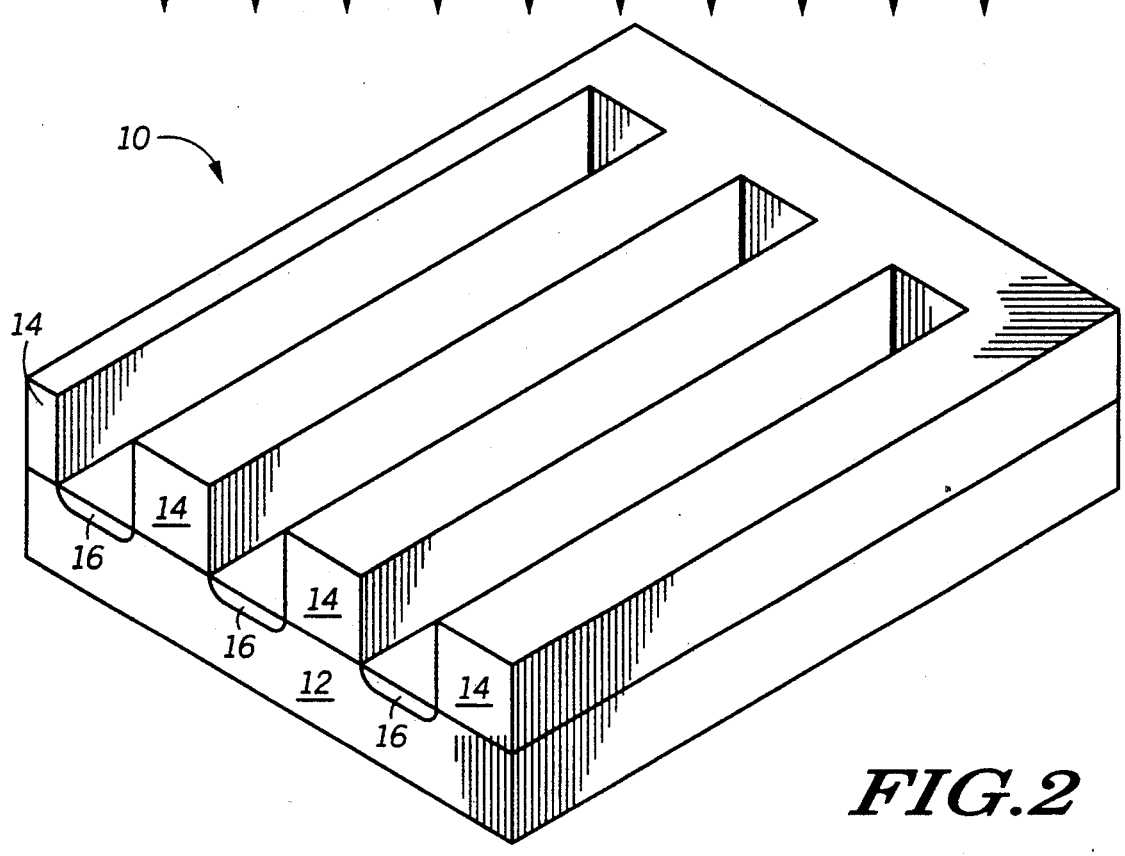

In FIG. 2, a plurality of rectangular features is lithographically defined in masking layer 14. Other methods, such as removable spacers, exist which will allow an opening formation without the use of lithography. The openings in masking layer 14 are typically less then two microns in width and spaced apart by no more than roughly two microns. A diffusion process, an ion implantation process, or a like doping step is used to dope the substrate 12 through the openings in masking layer 14 to form doped regions 16. Doped regions 16 are usually doped with dopant atoms such as boron, phosphorus, arsenic or a combination of these elements.

Figure 3:
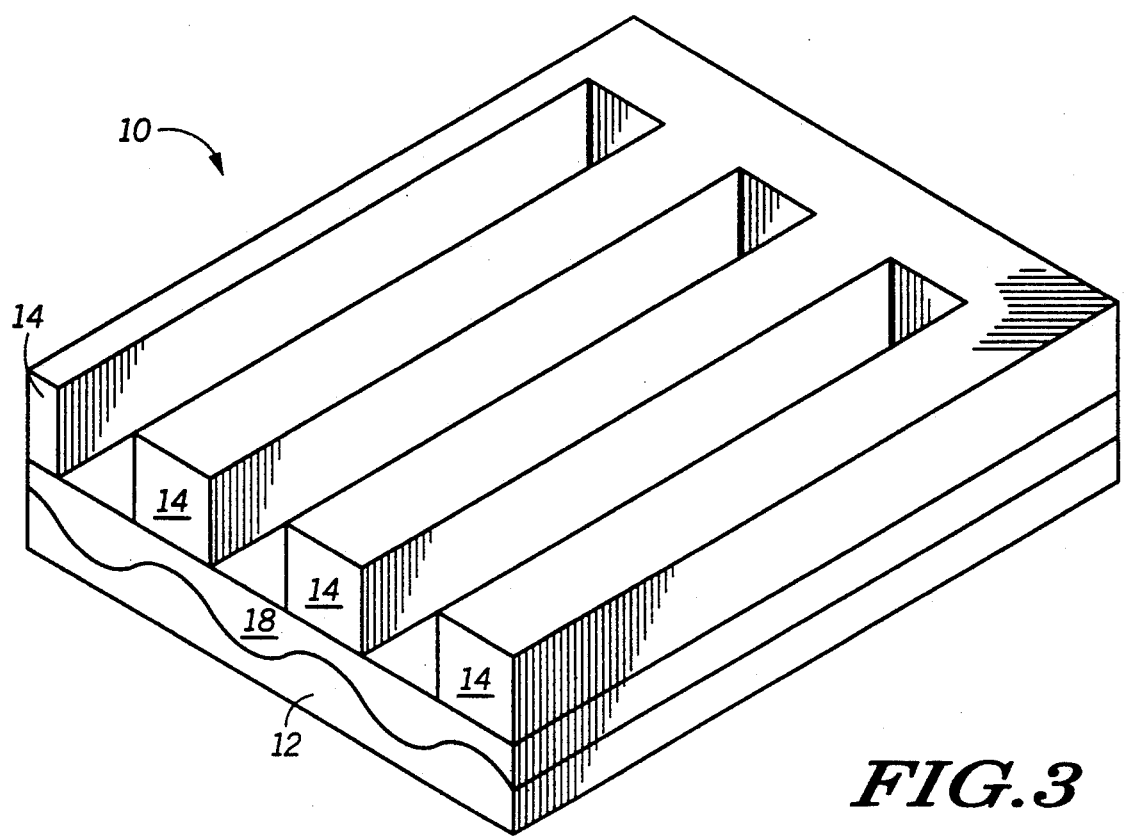

In FIG. 3, a thermal cycle or heating step is used to drive the dopant atoms out of doped regions 16 to form a continuous well of doped material 18 within the substrate 12. The masking layer 14 is usually removed prior to the thermal cycle, but is illustrated in FIG. 3 and in subsequent figures for conceptual reasons. For example, removal of the masking layer 14 prior to the thermal cycle is recommended when the masking layer 14 is made of photoresist. The required heating time and the amount of distribution of the dopant atoms is a function of both the size of the openings in masking layer 14 and the spacing between the openings in masking layer 14.

Figure 4:
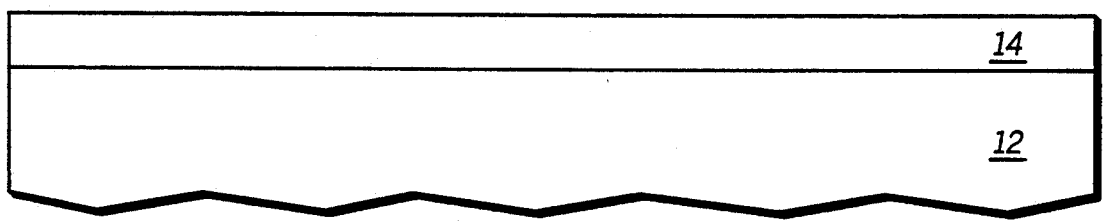
FIGS. 4-6 illustrate, in cross-sectional form, a method for forming a first doped region and a second doped region both in accordance with the present invention.
Figure 5:
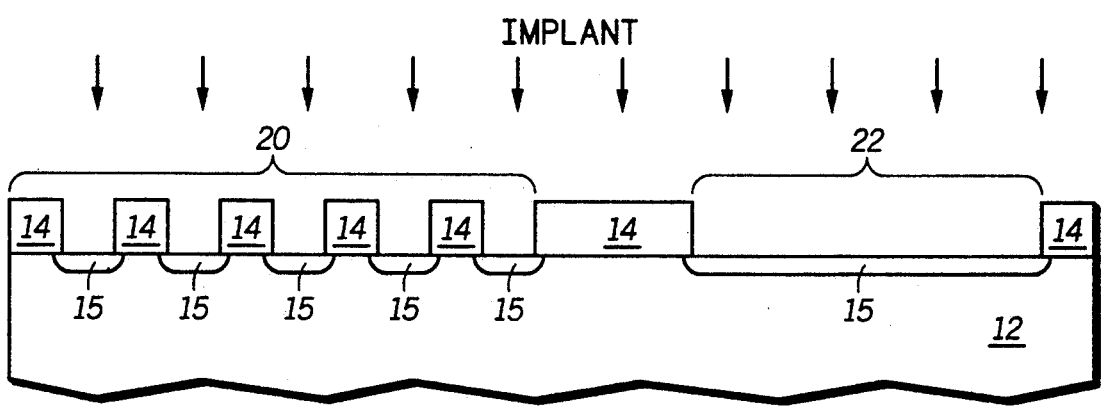
Figure 6:
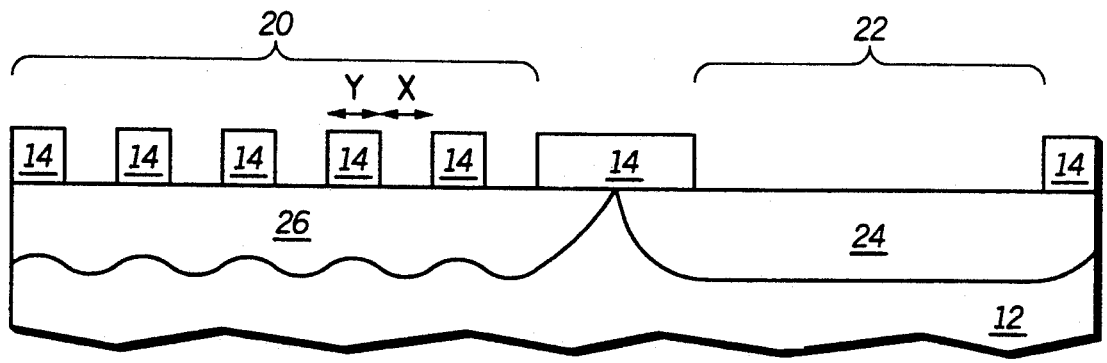

In FIGS. 4-6, a method for forming two doped regions within the substrate 12 is illustrated. By using the method illustrated in FIGS. 1-3 along with a conventional well implanting and masking approach, two doped regions may be formed from a single implant wherein the two doped regions each have different doping profiles and different doping depths. This method of forming two wells with one implant step reduces processing time, process cost, and process complexity by reducing processing steps and reducing masking steps. The wells which are formed in FIGS. 4-6 are also self-aligned to one another without the need for accurate lithographic alignment.

FIG. 4 illustrates the substrate 12 and the masking layer 14. In FIG. 5, the masking layer is etched to form a first region 20 of the masking layer 14. In the first region 20, the masking layer 14 is etched to form a plurality of rectangular regions as illustrated. A second region 22 is formed wherein the masking layer 14 has one big opening as in conventional well formation technology. An ion implant step or a like doping step is used to form doped regions 15 within the substrate 12. The doped regions contain dopant atoms such as boron, arsenic, and/or phosphorus.

In FIG. 6, the doped regions 15 from FIG. 5 have been heated to thermally drive the dopant atoms to form a first well region 26 within region 20 and a second well region 24 within region 22. The well region 24 has a higher doping concentration and a deeper doping profile due to the differences in implant dose resulting from the differences in masking layer 14 between regions 20 and 22. Because region 20 is more protected by masking layer 14 than is region 22, region 20 receives less total dopant atoms per surface area than region 22. The amount of dopant atoms received by the substrate 12 within region 20 is a function of the width "X" of the openings of masking layer 14 and the spacing "Y" of the openings in masking layer 14. In summary, a twin well substrate is formed via well regions 24 and 26 using a single mask and single implant technique.

Figure 7:
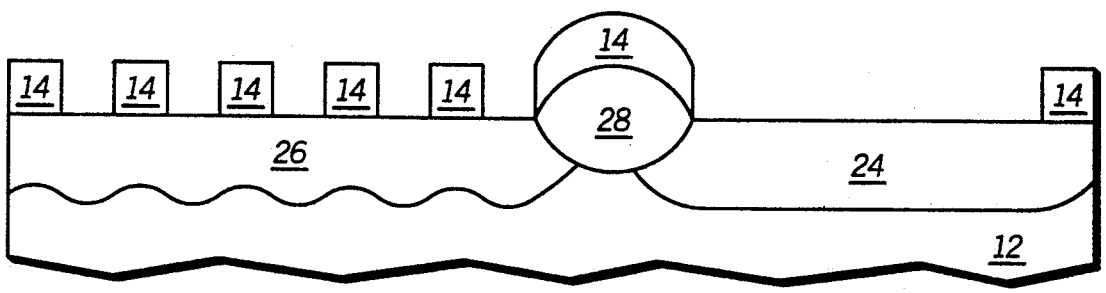
FIG. 7 illustrates, in cross-sectional form, another method for forming a first doped region and a second doped region both in accordance with the present invention.

FIG. 7 illustrates that the method illustrated in FIGS. 4-6 and discussed above can be used with a field oxide region 28. Field oxide region 28 may also be replaced by other known isolation methods such as trench isolation and the like.

Figure 8:
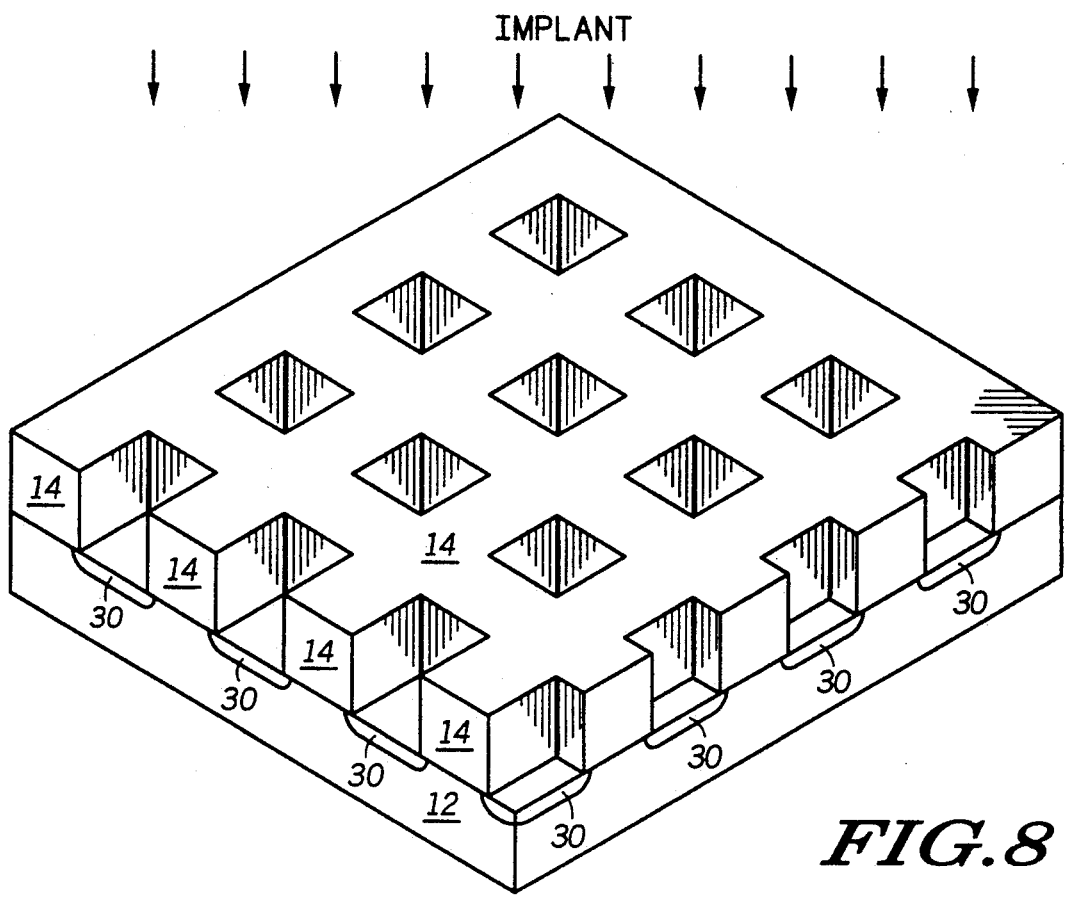
FIGS. 8-9 illustrate, in three-dimensional perspective form, another method for forming a doped region in accordance with the present invention.

In FIG. 8, the substrate 12 and the masking layer 14 are illustrated. A checker board pattern is etched into the masking layer to expose even less substrate area than that exposed in FIG. 2. An ion implant step is used to form doped regions 30 within the substrate as illustrated.

Figure 9:
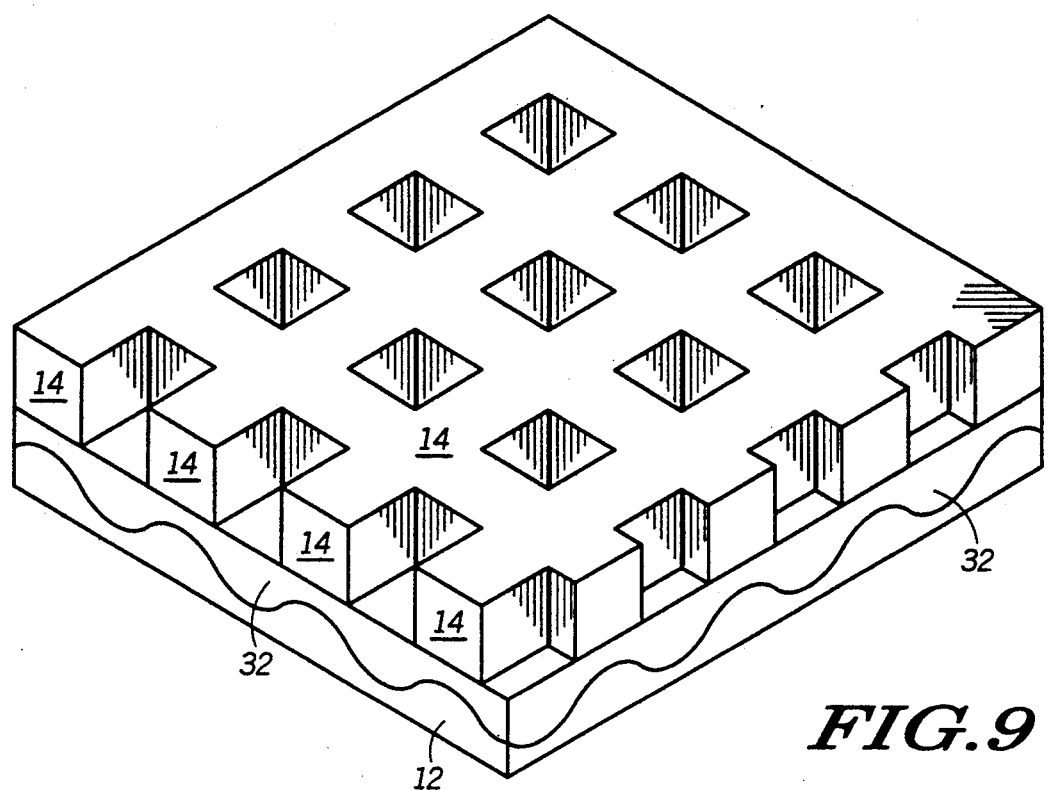

In FIG. 9, a thermal drive step is used to drive all of the doped regions 30 into a single doped well 32. As stated before, the masking layer 14 is usually removed prior to thermal drive, but is illustrated in FIG. 9 for conceptual reasons. The checker board method taught in FIG. 9 may be used in conjunction with FIGS. 3-6 to form a third distinct well with a single mask and implant step. In general, N distinct wells, where N is a positive integer, may be formed by forming N distinct patterned areas of masking layer 14. Each of the N areas of masking layer 14 expose a different percentage of substrate surface area. If the ratio of exposed substrate surface area to protected substrate surface area is high, then a high concentration well is formed having a deeper junction depth. If the ratio of exposed substrate surface area to protected substrate surface area is low, then a low concentration well is formed having a shallower junction depth.

Figure 10:
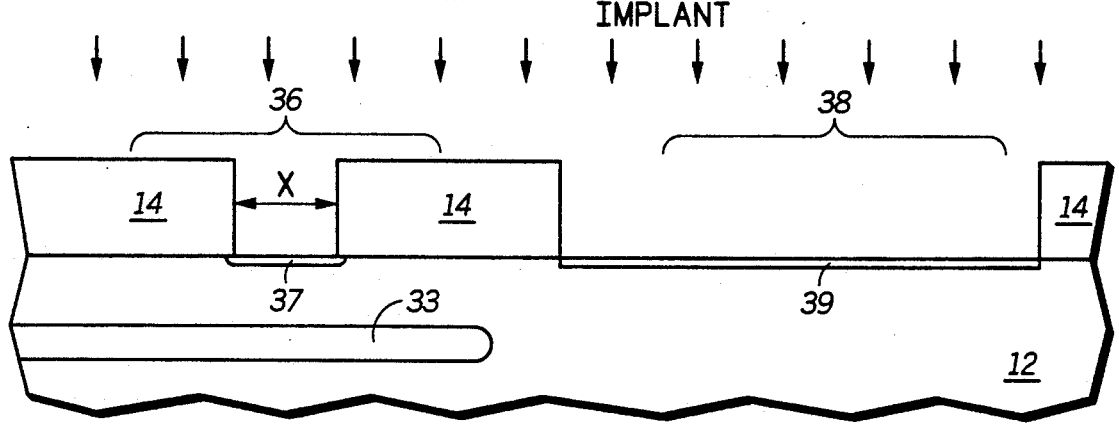
FIGS. 10-11 illustrate, in cross-sectional form, a method for forming both a bipolar device and a complementary metal oxide semiconductor (CMOS) device using doped regions in accordance with the present invention.
Figure 11:
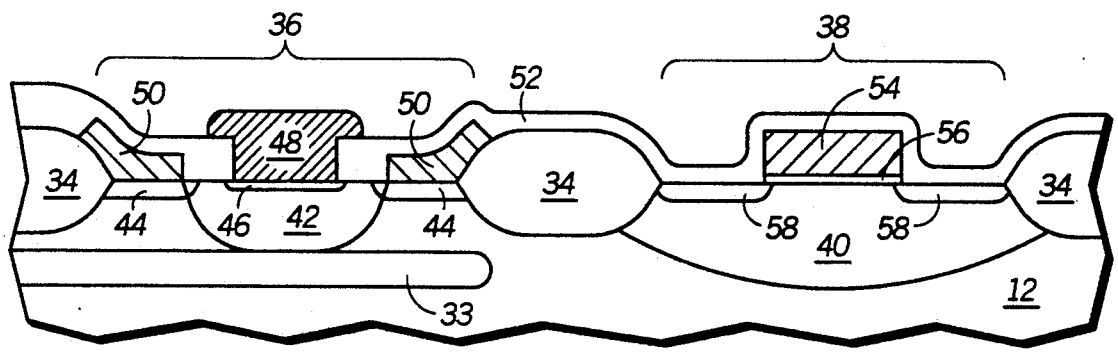

In FIGS. 10-11, a method for forming a twin doped substrate is used to form complementary metal oxide semiconductor (CMOS) regions and bipolar regions in a single ion implant step. In FIG. 10, a substrate 12 is provided. A buried collector 33 is formed. The masking layer 14 is used to form a region 36 and a region 38. Region 36 has a small opening in masking layer 14 and will therefore allow fewer dopant atoms into the substrate 12 than region 38. Region 38 has a larger opening in masking layer 14 and will therefore allow more dopant atoms into the substrate 12 than region 36. An ion implant step is used to form doped regions 37 and 39.

In FIG. 11, field oxide regions 34 are formed. A metal oxide semiconductor (MOS) transistor is formed within region 38 and a bipolar transistor is formed within region 36. The doped region 37 is thermally driven to form a doped region 42. The doped regions 39 is thermally driven to form a doped region 40. Source and drain regions 58 are formed within the region 38. A gate electrode 54 is formed within the region 38. The doped regions 42 and 44 form a base region. A doped region 46 forms an emitter region within region 36. Conductive layers 48 and 50 make electrical contact to the bipolar transistor electrodes. The collector contact to buried collector 33 is not illustrated.

By forming region 42 from region 37, region 42 is formed as a lightly doped while a heavier doped region 40 is formed for CMOS devices. Regions 40 and 42 are formed by using a single ion implant step. FIGS. 10-11 also illustrate the fact that a plurality of openings in a masking layer is not required. The size of a single opening may determine the doping concentration and the doping junction depth for a device. In some cases, multiple openings (see FIG. 2 or FIG. 8) in the masking layer 14 may be used to form the well region 42. Reduced parasitic capacitances are achieved in the bipolar transistor by using the method illustrated in FIGS. 10-11.

Figure 12:
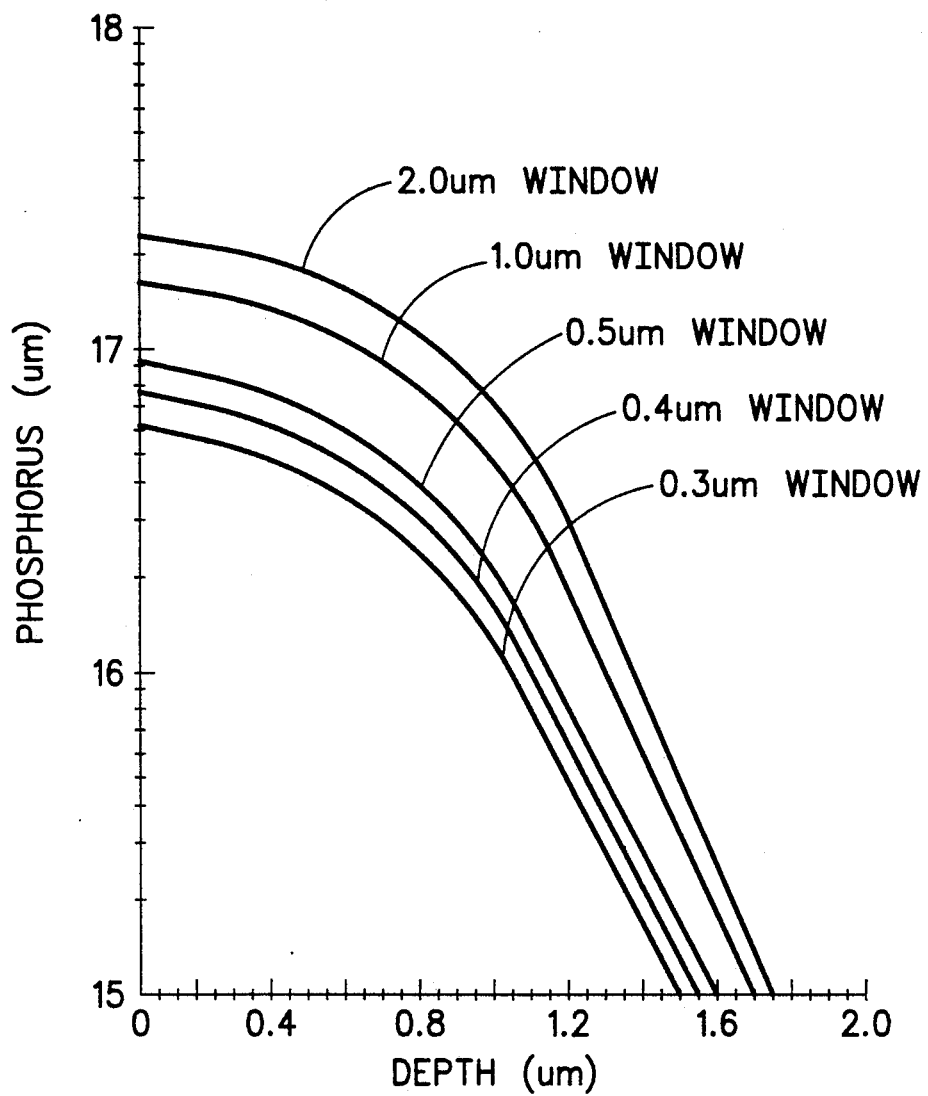
FIG. 12 illustrates a graph of a plurality of doping profiles from a plurality of doped regions in accordance with the present invention.

In FIG. 12, a graph illustrates the doping concentration (phosphorus is used as an example) and the doping depth of a doped region as a function of opening size (for an illustration of opening size see "X" in FIG. 6 or FIG. 10). In FIG. 12, a 2.0 micron-wide window will create a doped region having a surface concentration (i.e. concentration at 0.0 micron depth) of $1.13 \times 10^{17}$ dopants/cm$^3$ and a doping depth of roughly 1.75 microns. Doping depth is arbitrarily defined in FIG. 12 as being the depth at which the doping concentration drops below $1 \times 10^{15}$. In FIG. 12, a 1.0 micron-wide window will create a doped region having a surface concentration (i.e. concentration at 0.0 micron depth) of $1.08 \times 10^{17}$ dopants/cm$^3$ and a doping depth of roughly 1.70 microns. A 0.5 micron-wide window will create a doped region having a surface concentration of $9.0 \times 10^{16}$ dopants/cm$^3$ and a doping depth of roughly 1.59 microns. A 0.4 micron-wide window will create a doped region having a surface concentration of $8.0 \times 10^{16}$ dopants/cm$^3$ and a doping depth of roughly 1.55 microns. A 0.3 micron-wide window will create a doped region having a surface concentration of $6.0 \times 10^{16}$ dopants/cm$^3$ and a doping depth of roughly 1.50 microns.

As graphically illustrated in FIG. 12, as the opening of the window in mask layer 14 decreases, the doping concentration of the doped region decreases and the doping junction depth of the doped region decreases. Generally, FIG. 12 illustrates the vertical phosphorus profile at a center of a window implant region.

Figure 13:
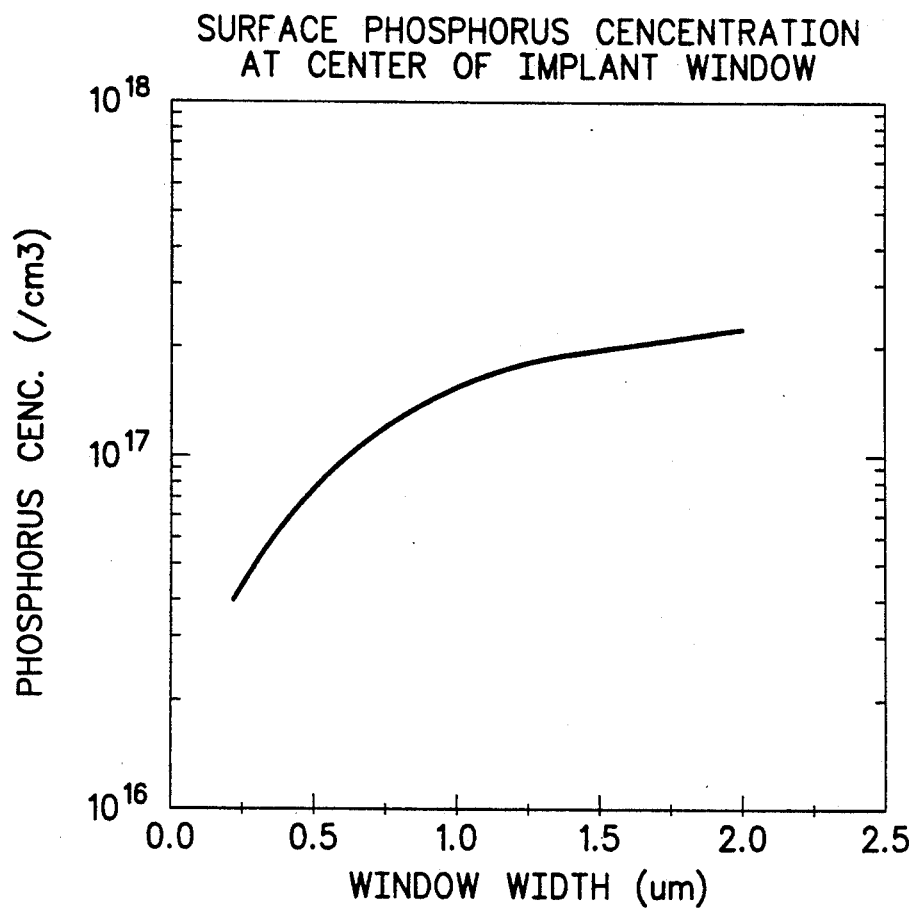
FIG. 13 illustrates a graph of doping concentration for a doped region as a function of masking layer window opening width in accordance with the present invention.

FIG. 13 illustrates a graph of surface doping concentration versus window width "X". In FIG. 13, as window width is decreased, the surface phosphorus concentration decreases in a logarithmic manner toward zero. More specifically, FIG. 13 illustrates the surface phosphorus concentration at the center of an implant window as a function of the window width.

Figure 14:
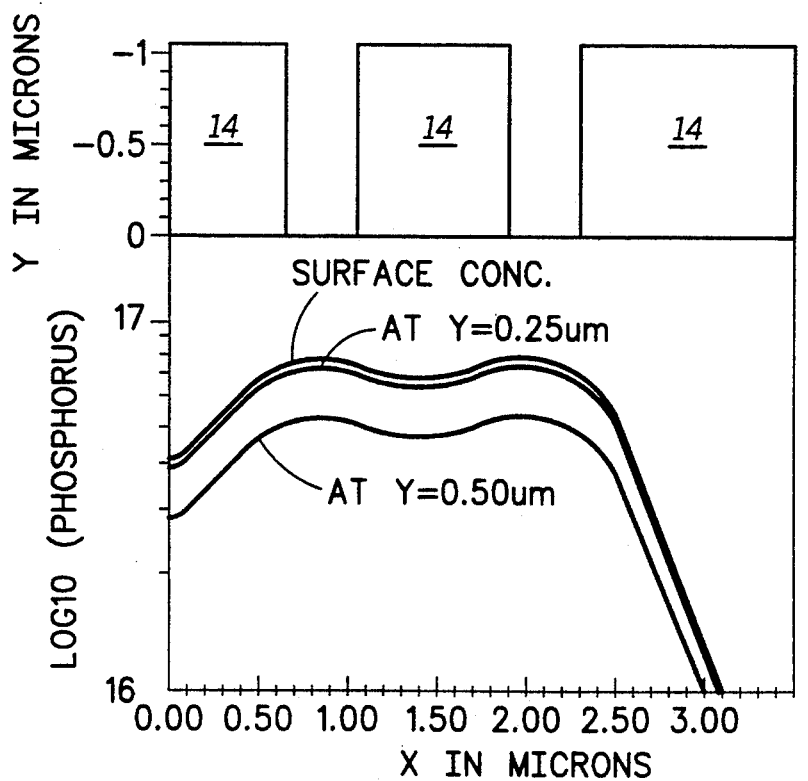
FIGS. 14-16 illustrate graphs of lateral doping uniformity for doped regions in accordance with the present invention.

FIG. 14 graphically illustrates the lateral dopant uniformity of a doped region as a function of opening width and opening spacing. FIG. 14 illustrates a masking layer 14 having a plurality of openings. Each of the openings in the plurality of openings are roughly 0.4 micron in width and are spaced apart by roughly 0.8 micron. FIG. 14 illustrates that 0.4 micron openings separated by 0.8 micron spaces forms a doped region which varies laterally in surface doping concentration from roughly $3.0 \times 10^{16}$ to $9 \times 10^{16}$ in a lateral direction after a brief thermal cycle. Three different vertical depths are used to illustrate the doping concentration in FIG. 14.

Figure 15:
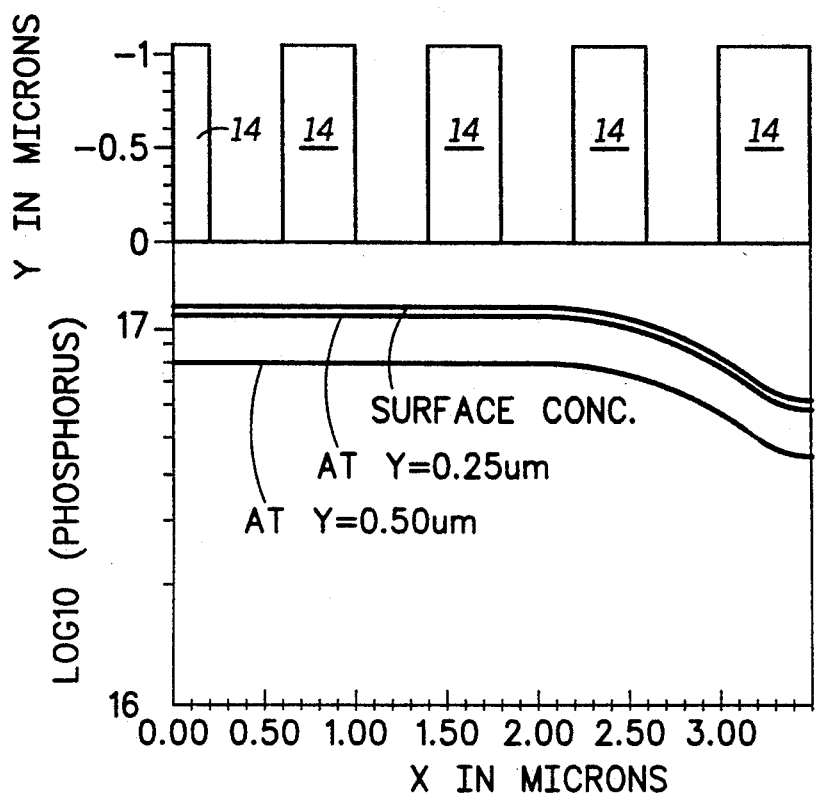

FIG. 15 graphically illustrates the lateral dopant uniformity of a doped region as a function of opening width and opening spacing. FIG. 15 illustrates a masking layer 14 having a plurality of openings. Each of the openings in the plurality of openings are roughly 0.4 micron in width and are spaced apart by roughly 0.4 micron. The pattern of masking layer 14 is continuos to the left of the X axis in FIG. 15. FIG. 15 illustrates that 0.4 micron openings separated by 0.4 micron spaces forms a doped region which does not vary significantly in doping concentration in a lateral direction after a brief thermal cycle. Three different vertical depths are used to illustrate the doping concentration in FIG. 15.

Figure 16:
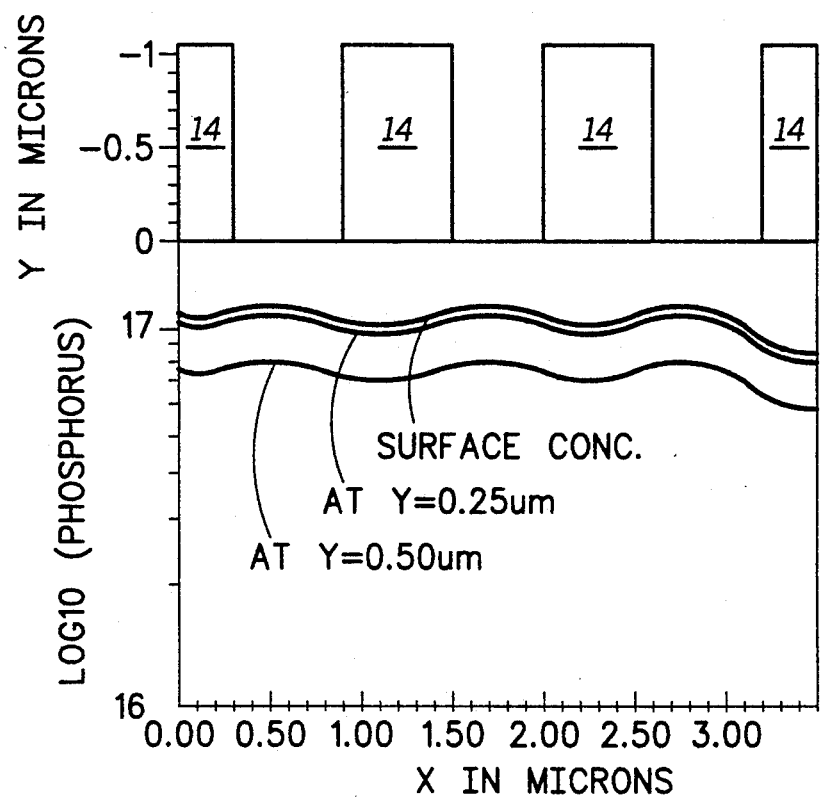

FIG. 16 graphically illustrates the lateral dopant uniformity of a doped region as a function of opening width and opening spacing. FIG. 16 illustrates a masking layer 14 having a plurality of openings. Each of the openings in the plurality of openings are roughly 0.6 micron in width and are spaced apart by roughly 0.6 micron. The pattern of masking layer 14 is continuos to the left of the X axis in FIG. 16. FIG. 16 illustrates that 0.6 micron openings separated by 0.6 micron spaces forms a doped region which varies only slightly in doping concentration in a lateral direction after a brief thermal cycle. Three different vertical depths are used to illustrate the doping concentration in FIG. 16.

FIGS. 14–16 collectively illustrate that spacing dimensions and spacing separation significantly influence lateral doping uniformity, doping concentration, and doped region junction depth. The mask and implant techniques taught herein may therefore be exactly constructed to form one or more doped regions or well regions each having a specific/different doping depth, a specific/different doping concentration, and a specific/different doping uniformity.

Figure 17:
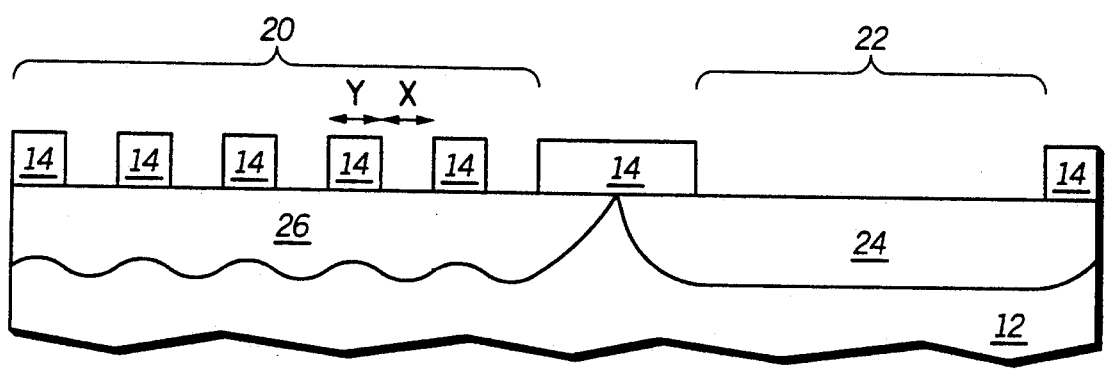
FIGS. 17-18 illustrate, in cross-sectional form, a method for forming a two buried doped regions in accordance with the present invention.
Figure 18:
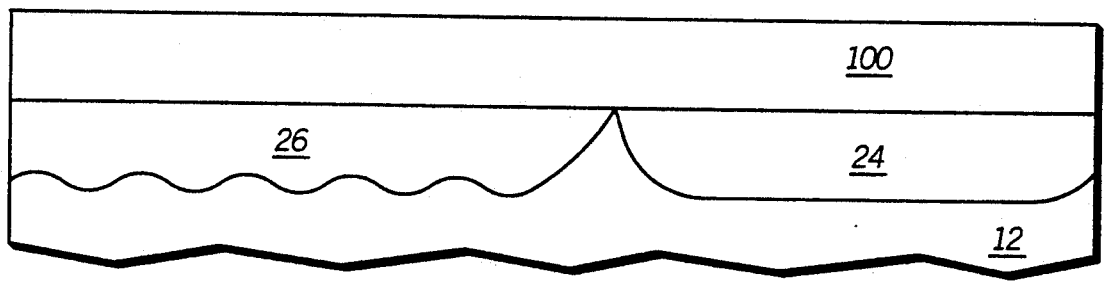

FIGS. 17–18 illustrate that the inventive mask and implant technique taught herein may be used to form two or more buried layers having different doping concentrations. In FIG. 17, two or more doped regions (i.e. well regions 24 and 26) are formed within the substrate 12 as illustrated in FIGS. 4–6. FIG. 17 is identical to FIG. 6. Once the doped regions have been formed, FIG. 18 illustrates that the masking layer 14 is removed. An epitaxial/selective growth step is used to form buried layers from the doped regions 24 and 26 via the formation of an epitaxial growth layer 100. The epitaxial growth layer 100 may be insitu doped, undoped, ion implanted, or the like. The buried layers may be formed, for example, as an N+ buried layer and an N buried layer combination or a P+ buried layer and a P buried layer combination. In a preferred form, the epitaxial growth layer 100 is a semiconductive material and may be selectively grown or formed via a blanket growth process (i.e. a growth region is formed across the entire integrated circuit).

While the present invention has been illustrated and described with reference to specific embodiments, further modifications and improvements will occur to those skilled in the art. For example, both phosphorus and arsenic may be implanted to form diffusion regions with different diffusion characteristics. The masking layers taught herein are usually always cut in rectangular, checker board, or square patterns, but other geometries exist. Triangles, circles, grids, crossing lines, crosses, and other geometries may be used to pattern the masking layers taught herein. Other forms of lithography such as phase shifting, X-ray lithography, E-beam lithography, and the like may be used to form features within the masking layers. The doped regions formed herein may be used to form BiCMOS devices, microcontroller circuits, combined digital/analog circuits, memory arrays, and the like. In FIG. 2 a dielectric layer (not illustrated) may optionally be formed between the masking layer 14 and the substrate 12. An implant may then be performed through the dielectric layer (not illustrated) for an improved doping profile. Doping profile and doping concentration are both affected by the process described herein. It should be understood that this invention may be used to implant non-dopant atoms such as oxygen and nitrogen. This technique of implanting non-dopant atoms may be useful for selective implantation of oxygen (SIMOX) or nitrogen when different oxide or nitride thicknesses are useful. It is to be understood, therefore, that this invention is not limited to the particular forms illustrated and that it is intended in the appended claims to cover all modifications that do not depart from the spirit and scope of this invention.

We claim:

1. A method for forming a first doped region and a second doped region of a semiconductor integrated circuit, the method comprising the steps of:

providing a substrate;

forming a masking layer overlying the substrate, the masking layer having a first region and a second region wherein the first region of the masking layer has a feature defined by a first geometry and the second region of the masking layer has a feature defined by a second geometry;

using a single doping step to form both the first doped region and the second doped region within the substrate, the first doped region having a first doping concentration and being formed under the first region of the masking layer, and the second doped region having a second doping concentration and being formed under the second region of the masking layer, the first doping concentration being different from the second doping concentration;

forming a first semiconductor device within the first doped region; and forming a second semiconductor device from the second doped region, the first semiconductor device being physically separated from the second semiconductor device.

2. The method of claim 1 wherein the step of using a single doping step comprises:

using only one ion implantation step to form the first and second doped regions.

3. The method of claim 1 wherein the step of using a single doping step comprises:

heating the substrate to thermally drive the first and second doped regions.

4. The method of claim 1 wherein the step of forming a masking layer comprises:

patterning said masking layer into a first patterned region and a second patterned region, the first patterned region being used to form the first doped region and the second patterned region being used to form the second doped region.

5. The method of claim 4 wherein the step of patterning the masking layer comprises:

forming each of the first and second patterned regions as a pattern selected from a group consisting of: a single rectangular opening or a plurality of rectangular openings.

6. The method of claim 1 further comprising the steps of:

forming a first plurality of integrated circuit devices within the first doped region; and forming a second plurality of integrated circuit devices within the second doped region.

7. A method for forming N doped well regions within a semiconductor integrated circuit wherein N is a positive integer greater than one, the method comprising the steps of:

providing a base layer of material, forming a masking layer overlying the substrate, the masking layer having N regions wherein each of the N regions of the masking layer have a different feature geometry;

using a single doping step to form all of the N doped well regions within the base layer of material, each of the N doped well regions corresponding to one of the N regions of the masking layer, each of the N doped well regions having a different doping concentration;

forming a first transistor device from one of the N doped well regions; and forming a second transistor device within another of the N doped well regions wherein the second transistor device is separate and distinct from the first transistor device.

8. The method of claim 7 wherein the step of using a single doping step comprises:

using a single ion implantation step to form the N doped well regions.

9. The method of claim 7 wherein the step of using a single doping step comprises:

heating the base layer of material to thermally drive the N doped well regions.

10. The method of claim 7 wherein the step of forming a masking layer comprises:

patterning said masking layer into a first patterned region and a second patterned region, the first patterned regions being used to form one of the N doped well regions and the second patterned region being used to form another of the N doped well regions.

11. The method of claim 10 wherein the step of patterning comprises:

forming each of the first and second patterned regions as a pattern selected from a group consisting of: a single rectangular opening or a plurality of rectangular openings.

12. The method of claim 7 wherein the step of forming a masking layer comprises:

forming the masking layer from one of either a photosensitive material or a hard mask material.

13. The method of claim 7 further comprising the steps of:

forming a first plurality of integrated circuit devices within the first doped region; and forming a second plurality of integrated circuit devices within the second doped region.

14. A method for forming a first doped region and a second doped region of a semiconductor integrated circuit, the method comprising the steps of:

providing a substrate having a first portion and a second portion;

forming a masking layer over the substrate, the masking layer having a first portion which overlies the first portion of the substrate and a second portion which overlies the second portion of the substrate;

defining both a first pattern within the first portion of the masking layer and a second pattern within the second portion of the masking layer;

doping the substrate with dopant atoms in a single doping process to form both the first doped region and second doped region within the substrate, the first doped region having a first doping concentration and the second doped region having a second doping concentration wherein the first and second doping concentrations are measurably different;

forming a first transistor device from the first doped region; and forming a second transistor device within the second doped region wherein the second transistor device and the first transistor device have separate control electrode regions.

15. The method of claim 14 wherein the step of doping the substrate comprises: .

using a single ion implantation step to form the first and second doped regions.

16. The method of claim 14 wherein the step of doping the substrate comprises:

heating the substrate to thermally drive the first and second doped regions.

17. The method of claim 15 further comprising the steps of:

forming more than one integrated circuit device within the first doped region; and forming at least one integrated circuit device within the second doped region.

18. A method for forming a first doped region and a second doped region of a semiconductor integrated circuit, the method comprising the steps of:

providing a substrate;

forming a patterned masking layer overlying the substrate, the patterned masking layer having a first patterned region and a second patterned region wherein the first and second pattern regions are patterned differently;

using a single doping step through the patterned masking layer to form both the first doped region and second doped region within the substrate, the first doped region having a first doping concentration and the second doped region having a second doping concentration which is different from the first doping concentration;

forming a metal oxide semiconductor (MOS) device within the first doped region; and forming a bipolar device using the second doped region.

19. The method of claim 18 wherein the step of using a single doping step comprises:

using ion implantation to form the first and second doped regions.

20. The method of claim 18 wherein the step of using a single doping step comprises:

heating the substrate to thermally drive the first and second doped regions.

21. A method for forming a first doped region and a second doped region of a semiconductor integrated circuit, the method comprising the steps of:

providing a substrate having a surface;

forming a masking layer overlying the substrate, the masking layer having a first region and a second region wherein the first region of the masking layer has a feature defined by a first geometry and the second region of the masking layer has a feature defined by a second geometry;

using a single doping step to form both the first doped region and second doped region within the substrate, the first doped region having a first doping concentration and being formed under the first region of the masking layer, and the second doped region having a second doping concentration and being formed under the second region of the masking layer, the first doping concentration being different from the second doping concentration;

removing the masking layer; and forming a semiconductive layer overlying the surface of the substrate to raise the surface of the substrate to form a raised substrate surface, the raised substrate surface making the first doped region into a first buried layer which underlies and is not in direct contact with the raised substrate surface and making the second doped region into a second buried layer which underlies and is not in direct contact with the raised substrate surface.

22. The method of claim 21 wherein the step of using a single doping step comprises:

using only one ion implantation step to form the first and second doped regions.

23. The method of claim 1 wherein the step of using a single doping step comprises:

heating the substrate to thermally drive the first and second doped regions deeper into the substrate.

24. The method of claim 1 wherein the step of forming a masking layer comprises:

patterning said masking layer into a first patterned region and a second patterned region, the first patterned region being used to form the first doped region and the second patterned region being used to form the second doped region.

* * * * *